US012676281B2

(12) United States Patent
Asakura et al.

(10) Patent No.: US 12,676,281 B2
(45) Date of Patent: Jul. 7, 2026

(54) SAMPLE HOLDER AND ELECTRON MICROSCOPE

(71) Applicant: Hitachi High-Tech Corporation, Tokyo (JP)

(72) Inventors: Yuji Asakura, Tokyo (JP); Michio Hatano, Tokyo (JP); Mitsuhiro Nakamura, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 425 days.

(21) Appl. No.: 18/281,871

(22) PCT Filed: Mar. 31, 2021

(86) PCT No.: PCT/JP2021/013940
§ 371 (c)(1),
(2) Date: Sep. 13, 2023

(87) PCT Pub. No.: WO2022/208774
PCT Pub. Date: Oct. 6, 2022

(65) Prior Publication Data
US 2024/0162000 A1 May 16, 2024

(51) Int. Cl.
*H01J 37/20* (2006.01)
*H01J 37/28* (2006.01)

(52) U.S. Cl.
CPC .............. *H01J 37/20* (2013.01); *H01J 37/28* (2013.01)

(58) Field of Classification Search
CPC .. H01J 37/00; H01J 37/02; H01J 37/20; H01J 37/26; H01J 37/28; H01J 2237/2003
(Continued)

(56) References Cited

U.S. PATENT DOCUMENTS 5,406,087 A * 4/1995 Fujiyoshi ................ H01J 37/26
850/18
2007/0125947 A1 6/2007 Sprinzak et al.
(Continued)

FOREIGN PATENT DOCUMENTS

JP 2006-518534 A 8/2006
JP 2008-512841 A 4/2008
(Continued)

OTHER PUBLICATIONS

International Search Report (PCT/ISA/210) issued in PCT Application No. PCT/JP2021/013940 dated May 25, 2021 with English translation (4 pages).
(Continued)

*Primary Examiner* — Jason L McCormack
(74) *Attorney, Agent, or Firm* — Crowell & Moring LLP

(57) ABSTRACT

The performance of a sample holder that is fillable with a liquid sample is improved. A sample holder 200 includes: an upper tip 300 that is disposed on an irradiation side of an electron beam; and a lower tip 400 that is disposed to face the upper tip 300. At this time, the sample holder 200 includes: a diaphragm 350 that is provided in the upper tip 300; a diaphragm 450 that is provided in the lower tip 400; a space 600 that is interposed between the diaphragm 350 and the diaphragm 450 and is fillable with a liquid; and a guide portion 340 that guides a liquid having an amount exceeding an amount of liquid with which the space 600 is fillable so as to be dropped from a side opposite to the irradiation side of the electron beam.

10 Claims, 13 Drawing Sheets

(58) Field of Classification Search
USPC ............................ 250/306, 307, 311, 440.11
See application file for complete search history.

(56) References Cited

U.S. PATENT DOCUMENTS

| | | | |
|---|---|---|---|
| 2008/0179518 A1 | 7/2008 | Creemer et al. | |
| 2012/0120226 A1* | 5/2012 | de Jonge ................. | H01J 37/20 |
| | | | 348/80 |
| 2013/0264476 A1* | 10/2013 | Damiano, Jr. .......... | H01J 37/18 |
| | | | 250/307 |
| 2016/0056012 A1 | 2/2016 | Ogura | |

FOREIGN PATENT DOCUMENTS

| | | |
|---|---|---|
| JP | 2013-535795 A | 9/2013 |
| JP | 2014-203733 A | 10/2014 |
| JP | 2016-72184 A | 5/2016 |

OTHER PUBLICATIONS

Japanese-language Written Opinion (PCT/ISA/237) issued in PCT
Application No. PCT/JP2021/013940 dated May 25, 2021 with
English translation (7 pages).

\* cited by examiner

[FIG. 1]
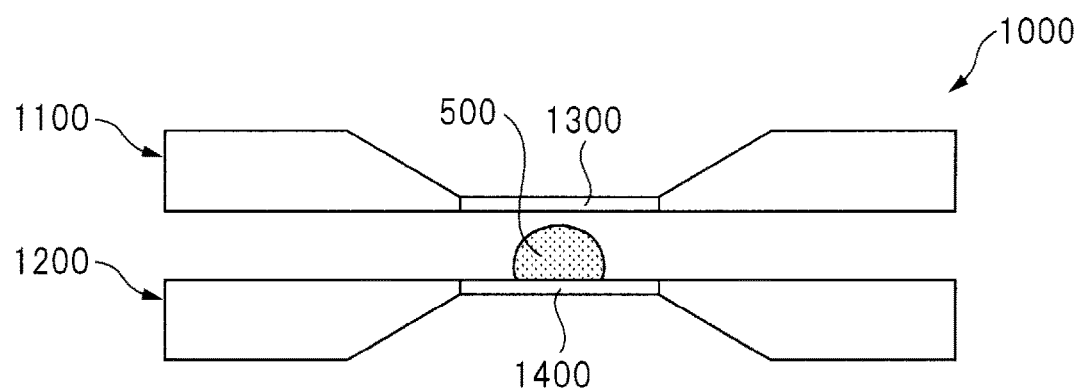
[FIG. 2]
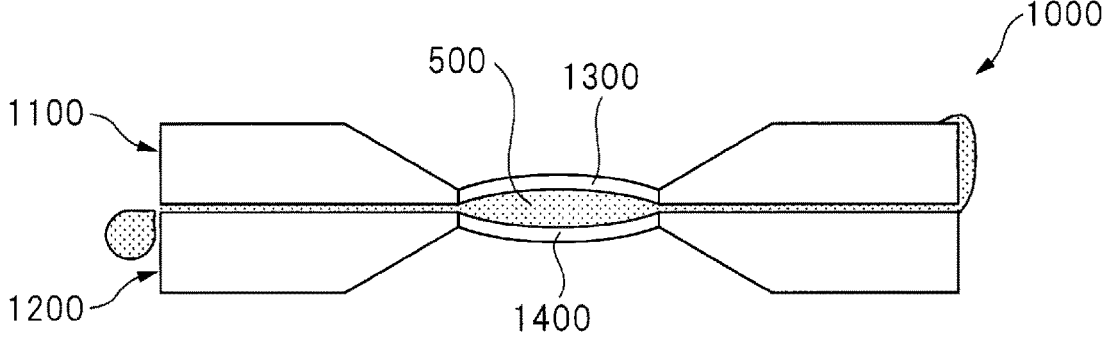

[FIG. 3]
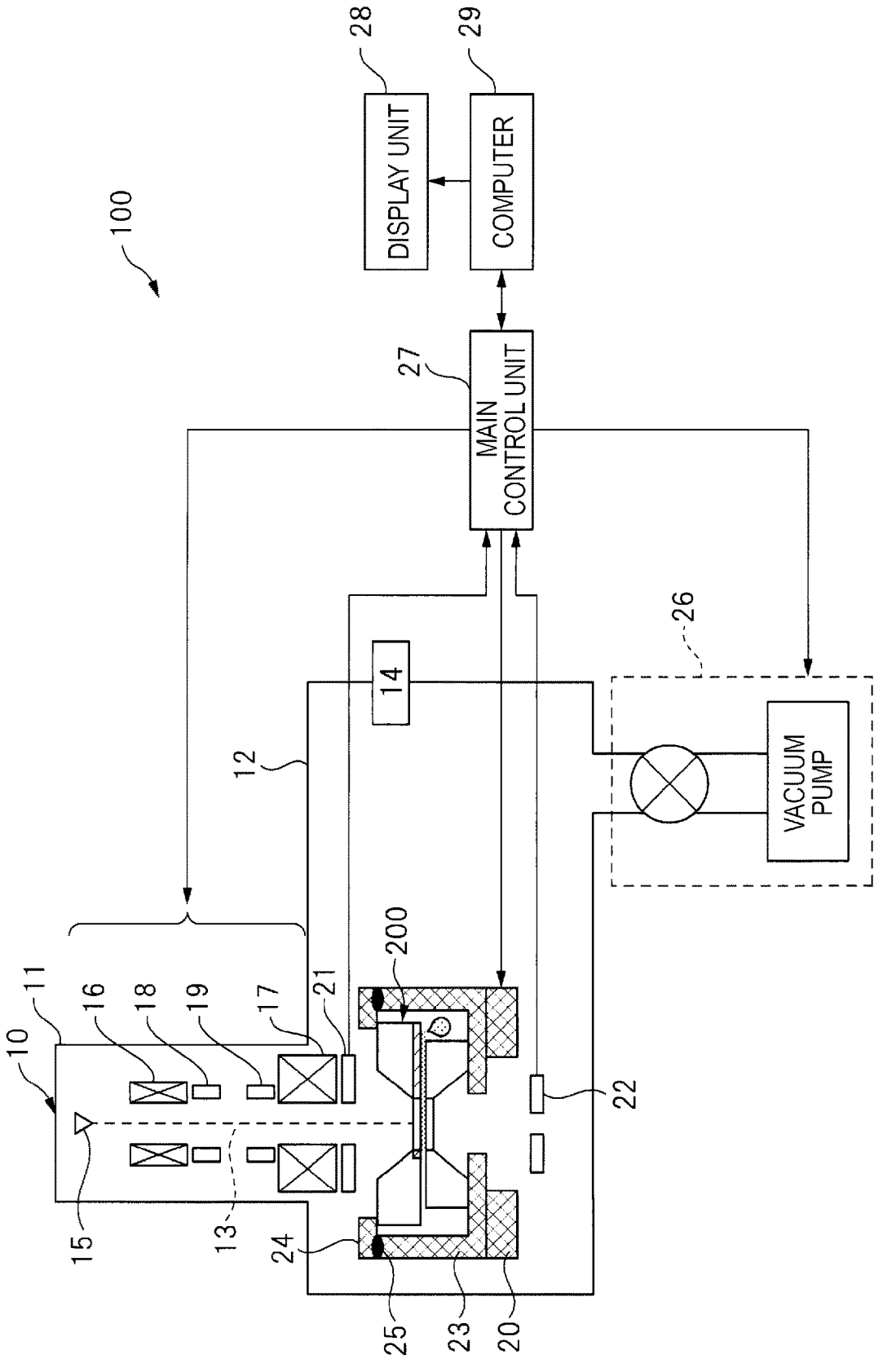

[FIG. 4]
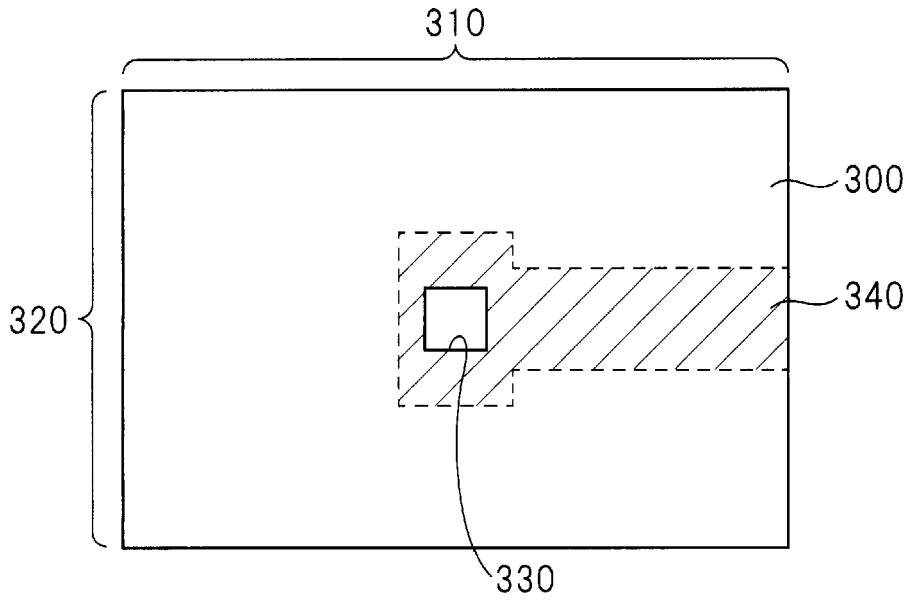
[FIG. 5]
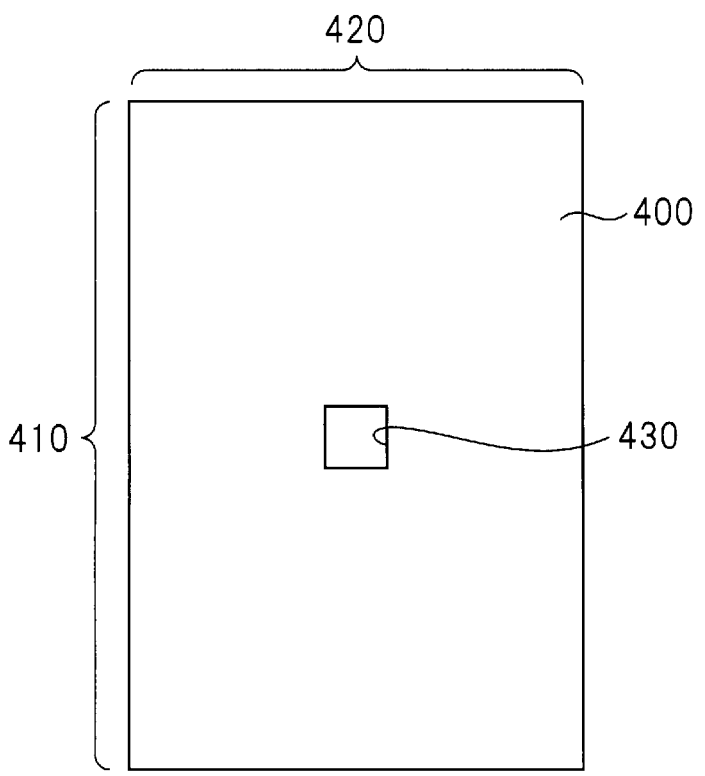

[FIG. 6]
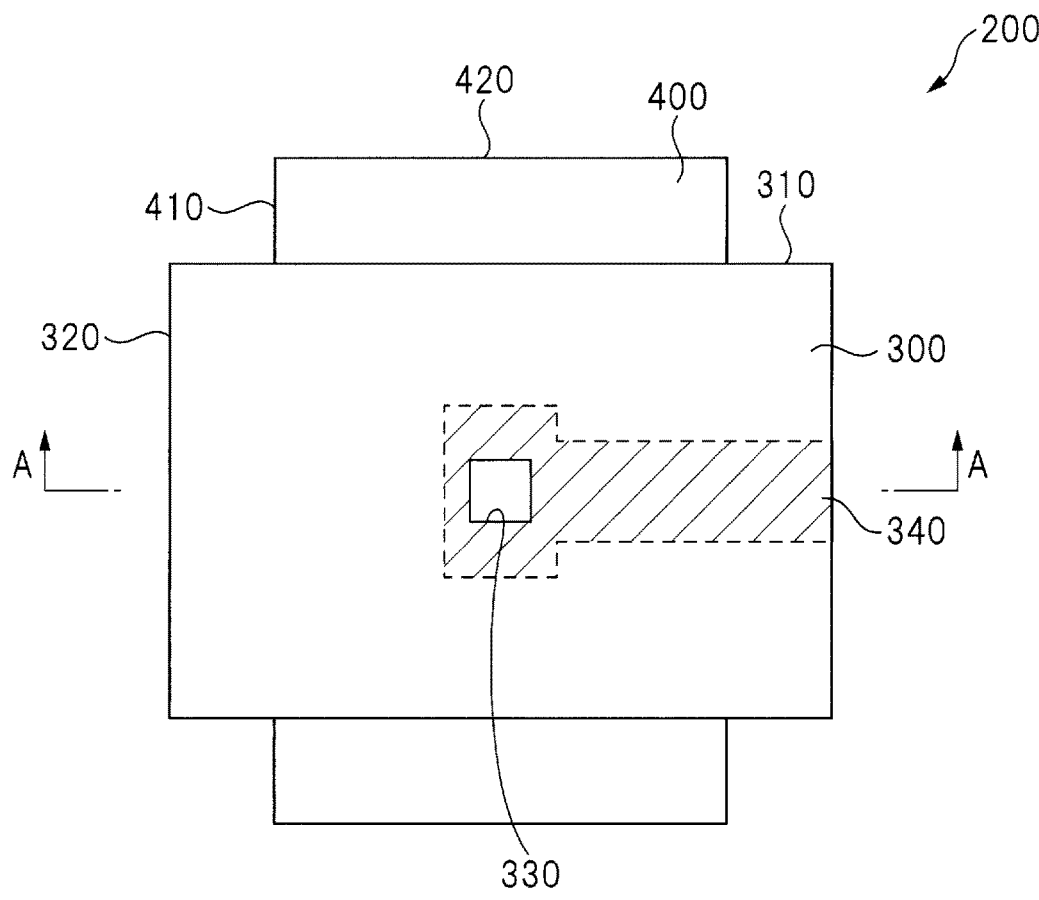
[FIG. 7]
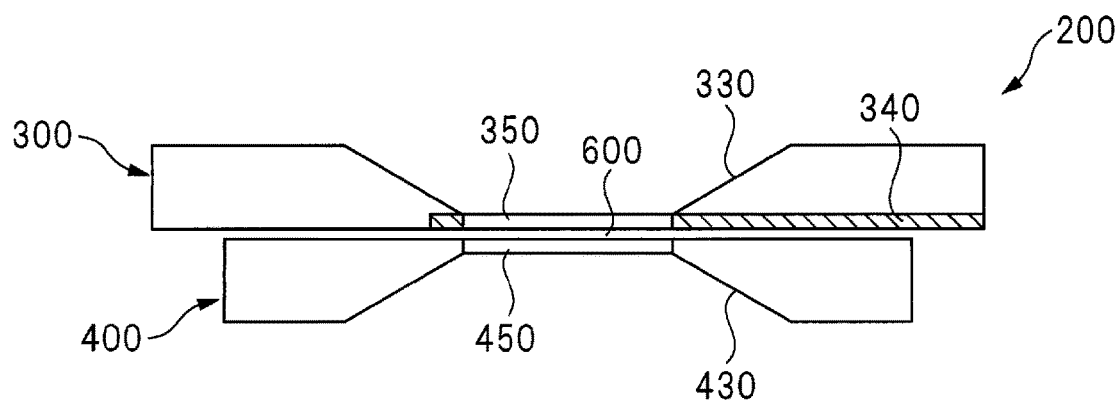

[FIG. 8]
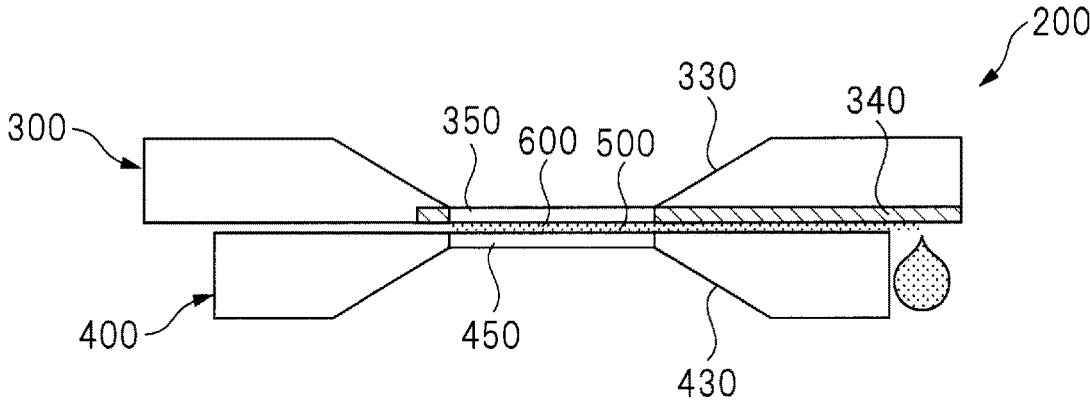
[FIG. 9]
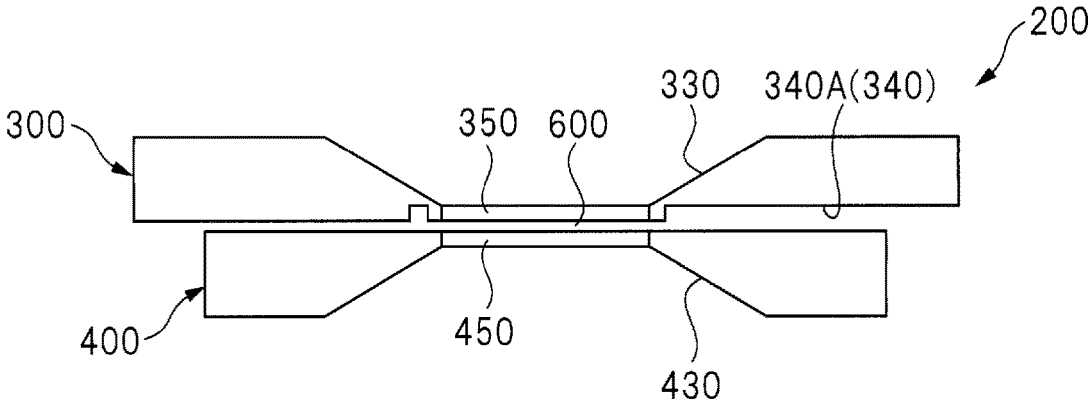

[FIG. 10]
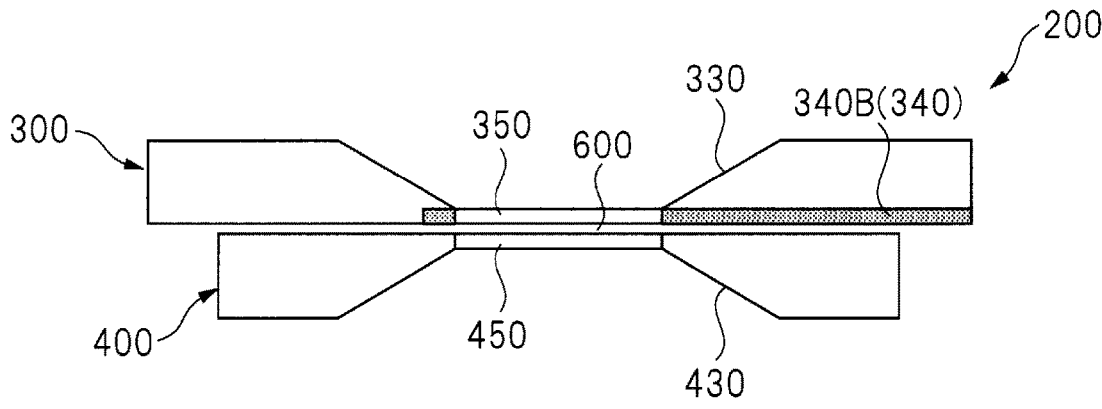

[FIG. 12]
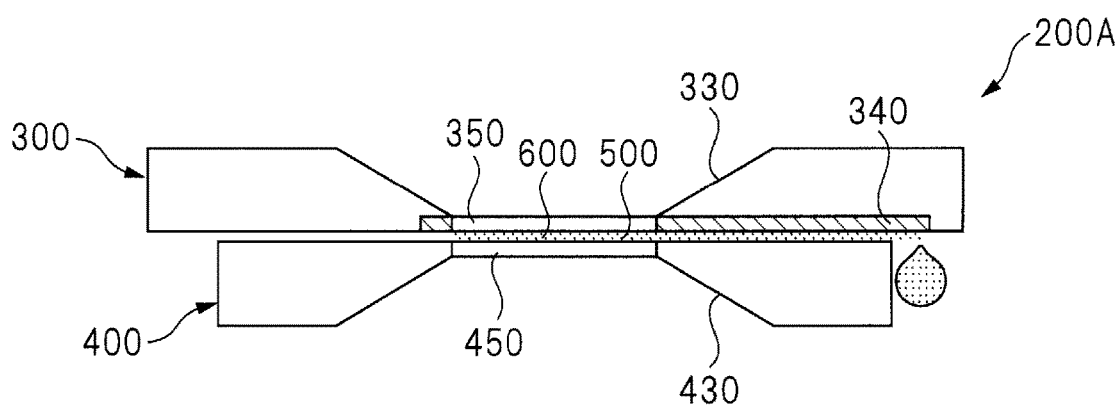

[FIG. 14]
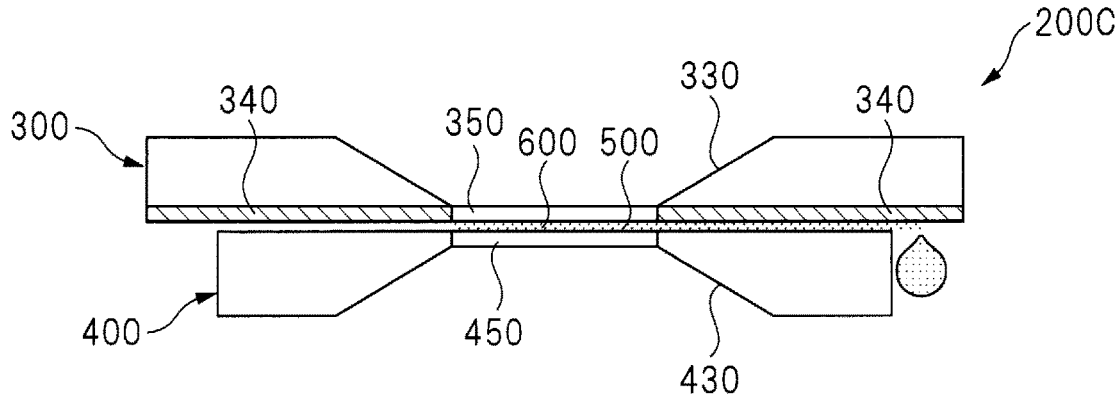
[FIG. 15]
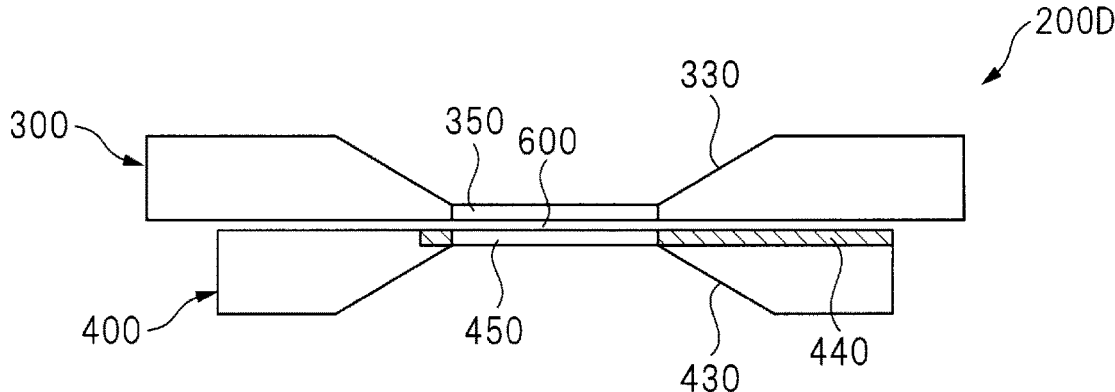

[FIG. 16]
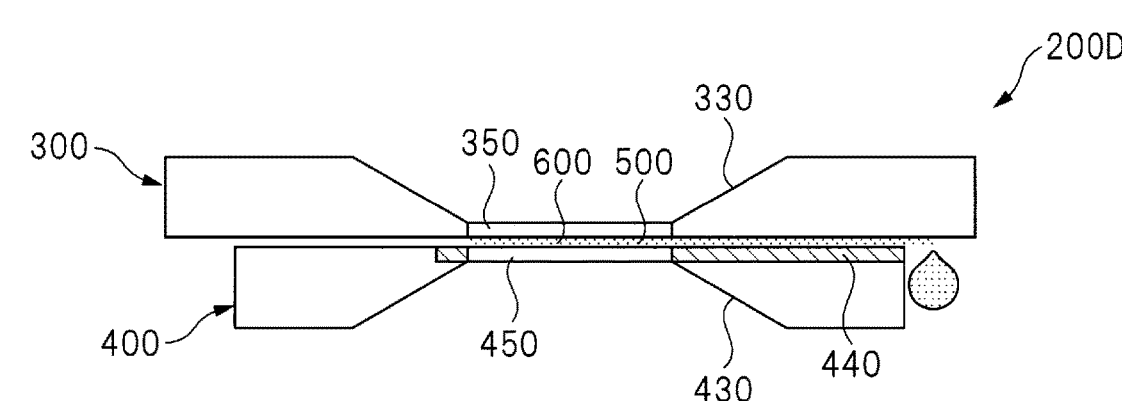

[FIG. 17]
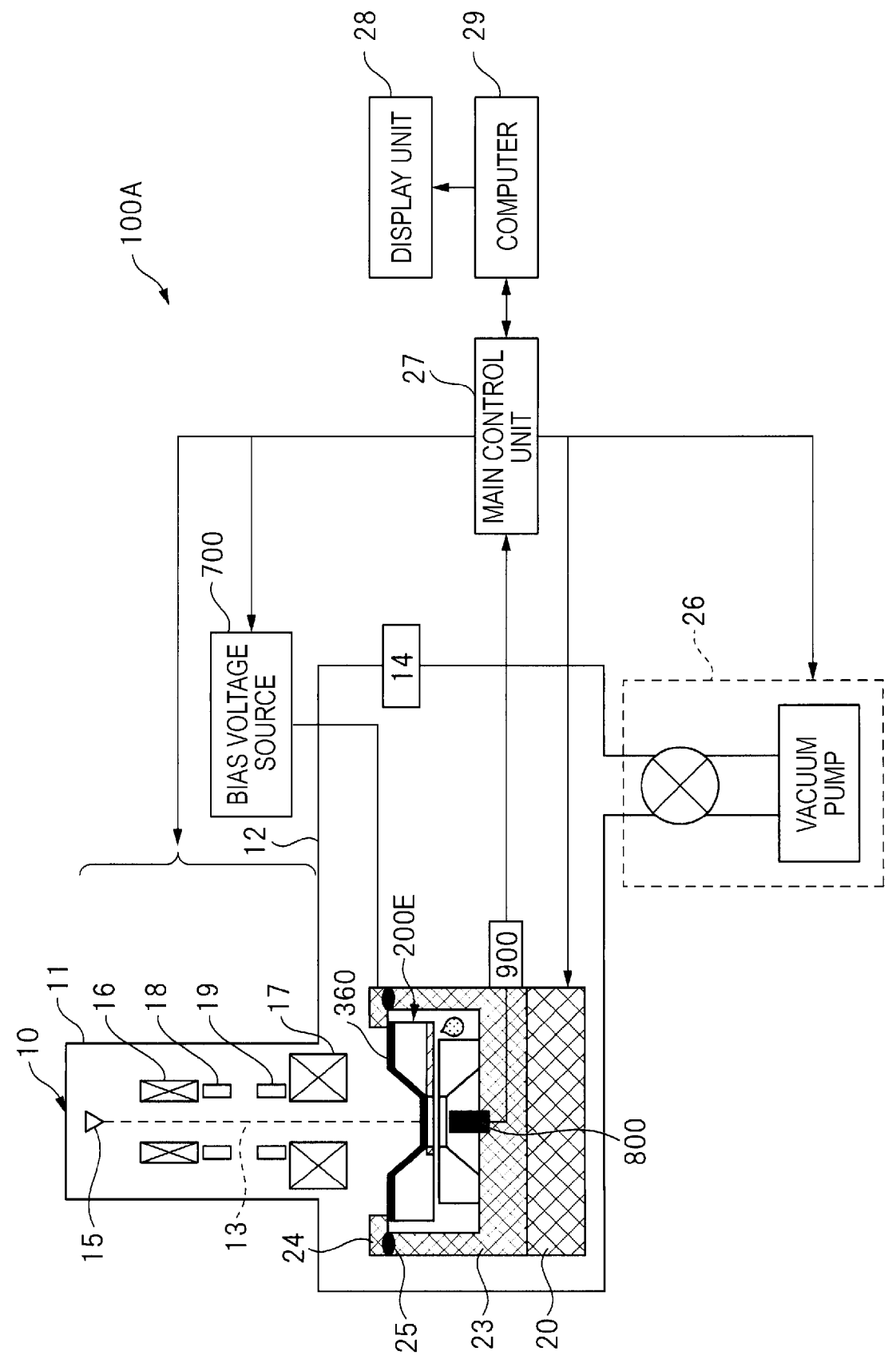

[FIG. 18]
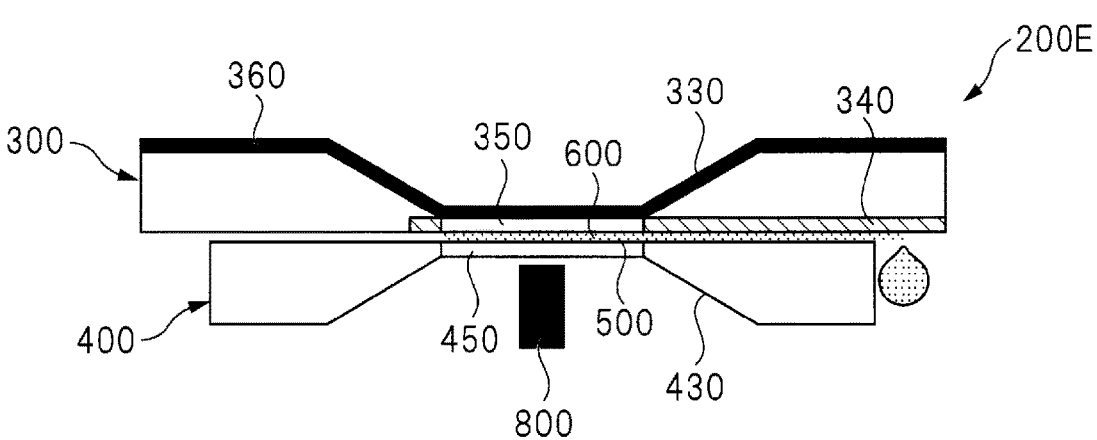

SAMPLE HOLDER AND ELECTRON MICROSCOPE

TECHNICAL FIELD

The present invention relates to a sample holder and an electron microscope and, for example, relates to a technique that is effective for application to a sample holder fillable with a liquid sample.

BACKGROUND ART

An electron microscope is a microscope that obtains an enlarged image of a measuring object using an electron beam. The electron beam is a wave having a very short wavelength in terms of an electromagnetic wave. As a result, the electron microscope using an electron beam can execute morphological observation at a much higher magnification than that of an optical microscope using visible light. Accordingly, the electron microscope is used for sample measurement in various fields. In particular, in the electron microscope, demands for observation of not only solid samples but also liquid samples have also been increased.

Here, "liquid" described herein refers to a variety of materials having fluidity and are used in a broad sense including not only general liquid materials but also gel materials.

In the electron microscope, a sample needs to be disposed in a vacuum during measurement. Therefore, when a liquid sample is measured, the following points are concerned. That is, when a liquid sample is directly disposed in an apparatus configuring the electron microscope, there is a risk that the liquid sample is volatilized such that a component to be observed cannot be measured or a risk that a sample chamber in the apparatus is contaminated with the volatilized liquid sample.

As a result, it is desired to devise the measurement of a liquid sample using the electron microscope.

Hereinafter, documents relating to a method of observing a liquid sample will be described as an example.

JP2013-535795A (PTL 1) describes a technique relating to a transmission electron microscope (TEM) or a scanning transmission electron microscope (STEM) that observes a sample by causing an electron beam as a probe to transmit through the sample and detecting electrons transmitted through the sample.

JP2006-518534A (PTL 2) describes a liquid sample container for a SEM and a technique relating to sample enclosure including a film having electron beam permeability and liquid impermeability.

JP2014-203733A (PTL 3) and JP2016-72184A (PTL 4) disclose a technique relating to an observation system and a sample holder for observing a biological sample alive in an aqueous solution using a scanning electron microscopy (SEM) without executing a staining process or an immobilization process.

CITATION LIST

Patent Literature

PTL 1: JP2013-535795A
PTL 2: JP2006-518534A
PTL 3: JP2014-203733A
PTL 4: JP2016-72184A

SUMMARY OF INVENTION

Technical Problem

In the observation system described in PTLs 1 to 4, in order to execute the observation using an electron beam, a space interposed between diaphragms having a thickness of several tens of nanometers to several hundreds of nanometers needs to be filled with a liquid sample. Regarding this point, the volume of the above-described space is extremely small with respect to a liquid sample to be dropped. Therefore, the liquid sample with which the space is not fillable may leak to the outside from an unexpected location. In particular, the leaked liquid sample may be attached to an upper surface of the diaphragm as an electron beam irradiation surface of the sample holder. In this case, it is known that there may be an adverse effect such as deterioration of an electron microscope image due to the effect of charge-up or the like. Due to this knowledge, it is desired to suppress the leakage of the liquid sample to an unexpected location.

Solution to Problem

A sample holder according to one embodiment includes: a first member that is disposed on an irradiation side of an electron beam; and a second member that is disposed to face the first member. At this time, the sample holder includes a first diaphragm that is provided in the first member, a second diaphragm that is provided in the second member, a space that is interposed between the first diaphragm and the second diaphragm and is fillable with a liquid, and a guide portion that guides a liquid having an amount exceeding an amount of liquid with which the space is fillable so as to be dropped from a side opposite to the irradiation side of the electron beam.

Advantageous Effects of Invention

According to one embodiment, it is possible to provide a sample holder that can suppress leakage of a liquid sample to an unexpected location.

BRIEF DESCRIPTION OF DRAWINGS

FIG. 1 is a diagram schematically illustrating a sample holder in the related art.

FIG. 2 is a diagram illustrating a room for improvement present in the related art.

FIG. 3 is a diagram illustrating a schematic configuration of a scanning electron microscope.

FIG. 4 is a plan view illustrating a planar shape of an upper tip.

FIG. 5 is a plan view illustrating a planar shape of a lower tip.

FIG. 6 is a plan view illustrating the sample holder.

FIG. 7 is a cross-sectional view taken along line A-A of FIG. 6.

FIG. 8 is a diagram illustrating a state where the sample holder is filled with a liquid sample.

FIG. 9 is diagram illustrating a first specific configuration example of a guide portion.

FIG. 10 is diagram illustrating a second specific configuration example of a guide portion.

FIG. 12 is a diagram schematically illustrating a sample holder according to a first modification example.

FIG. 14 is a diagram schematically illustrating a sample holder according to a third modification example.

FIG. 15 is a diagram schematically illustrating a sample holder according to a fourth modification example.

FIG. 16 is a diagram illustrating a state where the sample holder is filled with a liquid sample.

FIG. 17 is a diagram illustrating a schematic configuration of a scanning microscope.

FIG. 18 is a diagram illustrating a schematic configuration of the sample holder.

DESCRIPTION OF EMBODIMENTS

Figure 11A:
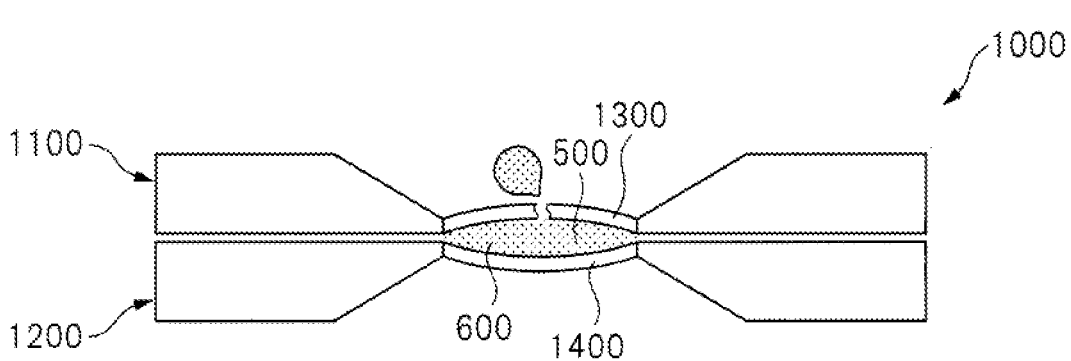
FIG. 11A is a diagram schematically illustrating breakage of a diaphragm.

In all the diagrams illustrating an embodiment, basically, the same members are represented by the same reference numerals, and the description thereof will not be repeated. In order to easily understand the drawing, the drawing may be a plan view or may be hatched.

<Necessity of Sample Holder>

An electron microscope is used for measurement of samples in various fields and is widely used for observation of not only solid samples but also liquid samples. Note that a sample used for the measurement with the electron microscope is typically disposed in a vacuum. Accordingly, for example, when a liquid sample is disposed in a vacuum for measurement with the electron microscope, there are a risk that the liquid sample is volatilized such that a component to be observed cannot be measured and a risk that a sample chamber in the electron microscope is contaminated with the volatilized liquid sample. A method that is most frequently adopted to avoid this problem is a method of packaging a liquid sample before measurement to insulate the liquid sample from the vacuum atmosphere. A structure used for packaging the liquid sample using this method is a sample holder. That is, in order to measure the liquid sample with the electron microscope, the sample holder that packages the liquid sample is required.

Note that, in the measurement with the electron microscope, simply with the configuration where the liquid sample is packaged, the state of the sample changes due to evaporation of a solvent or the like such that information of the liquid sample cannot be obtained even after being irradiated with an electron beam. Therefore, when the liquid sample is insulated from the vacuum atmosphere, a membrane such as a silicon nitride film is used.

DESCRIPTION OF RELATED ART

Hereinafter, the related art regarding the sample holder in which the liquid sample is confined through the membrane will be described.

"The related art" described in the present specification is not a well-known technique but a technique having the problem found by the present inventors, and is a technique on which the present invention is based.

FIG. 1 is a diagram schematically illustrating a sample holder 1000 in the related art.

In FIG. 1, the sample holder 1000 includes, for example: an upper tip 1100 that is disposed on an irradiation side of an electron beam; and a lower tip 1200 that is disposed to face the upper tip 1100. The upper tip 1100 and the lower tip 1200 are configured by, for example, a semiconductor material such as silicon or an insulating material. A diaphragm 1300 is provided in the upper tip 1100, and a diaphragm 1400 is provided in the lower tip 1200.

In the sample holder 1000 in the related art illustrated in FIG. 1, a liquid sample 500 is dropped on the diaphragm 1400 provided in the lower tip 1200, and subsequently an interval between the upper tip 1100 and the lower tip 1200 is narrowed. As a result, a space interposed between the diaphragm 1300 and the diaphragm 1400 is filled with the dropped liquid sample 500. As a result, the sample holder 1000 can be filled with the liquid sample 500.

When the liquid sample 500 with which the sample holder 1000 in the related art is filled is observed with the electron microscope, in order to obtain information by the electron beam irradiation, it is necessary to sufficiently reduce the distance between the diaphragm 1300 and the diaphragm 1400 by at most about several tens of micrometers. Therefore, in the liquid sample 500 dropped on the diaphragm 1400, the amount of the liquid sample 500 with which the sample holder 1000 can be filled is extremely reduced as compared to the amount of the dropped liquid sample 500. As a result, when the liquid sample having an amount more than or equal to the space volume of the sample holder 1000 is dropped, there is a room for the following improvement.

<Room for Improvement in Related Art>

For example, as illustrated in FIG. 2, the liquid sample 500 that cannot be filled may leak to the outside from an unexpected location of the sample holder 1000. Further, the leaked liquid sample 500 may be attached to an upper surface of the diaphragm 1300 as the electron beam irradiation surface. In this case, it is known that there may be an adverse effect such as deterioration of an electron microscope image due to the effect of charge-up or the like.

This way, in the sample holder 1000 in the related art, there is a room for improvement. The embodiment is devised for the room for the improvement in the related art. Hereinafter, a technical idea of the devised embodiment will be described. Specifically, the technical idea of the embodiment is a devise relating to the structure of the sample holder.

Hereinafter, before describing a sample holder according to the embodiment, an electron microscope in which the sample holder is used will be described. The sample holder according to the embodiment is applicable to various types of electron microscopes.

Specifically, the sample holder according to the embodiment is also applicable to an electron microscope that obtains an image by detecting secondary electrons or backscattered electrons or an electron microscope that obtains an image based on a change in detection current caused by a change in electric field generated from a dielectric constant distribution in a liquid sample.

Accordingly, first, the technical idea of the embodiment will be described using, as an example, the sample holder configured to be attachable to the electron microscope that obtains an image by detecting secondary electrons or backscattered electrons.

Next, the technical idea of the embodiment will be described using, as an example, the sample holder configured to be attachable to the electron microscope that obtains an image based on a change in detection current.

<Configuration of Scanning Electron Microscope>

FIG. 3 is a diagram illustrating a schematic configuration of the scanning electron microscope 100.

In FIG. 3, a housing 10 includes: a column 11 in which an electron optical system that irradiates a liquid sample as an observation target with an electron beam 13 is built; and a sample chamber 12 in which the liquid sample is disposed. When the liquid sample is irradiated with the electron beam 13, the housing 10 needs to be in a high vacuum environment. Therefore, in the sample chamber 12, a pressure sensor 14 for measuring an air pressure in the chamber is provided.

The electron optical system includes: an electron gun 15; a condenser lens 16 and an objective lens 17 that focus the electron beam 13 emitted from the electron gun 15 to irradiate the liquid sample with a micro spot; an astigmatism corrector 18 that corrects astigmatism of the electron beam 13; and a deflector 19 that deflects the electron beam 13 to two-dimensionally scan the liquid sample.

In the sample chamber 12, a stage 20 that is three-dimensionally movable is provided. In the stage 20, a sample holder 200 that is filled with a liquid sample as an observation target is mounted.

A detector 21 is provided immediately below the objective lens 17. The detector 21 is configured to detect backscattered electrons emitted due to an interaction with the irradiated electron beam 13 and the liquid sample and can be configured by, for example, a semiconductor detector, a scintillator, a light guide, a photomultiplier tube, or the like. In addition, a detector 22 is also provided below the stage 20. The detector 22 is configured to detect electrons transmitted through the liquid sample and, as in the detector 21, can be configured by, for example, a semiconductor detector, a scintillator, a light guide, a photomultiplier tube, or the like.

In the embodiment, the scanning electron microscope 100 may include either or both of the detector 21 and the detector 22.

The inside of the sample holder 200 is fixed to a hollow vacuum partition. The vacuum partition is configured by a vacuum partition lower component 23 and a vacuum partition upper component 24. The vacuum partition lower component 23 and the vacuum partition upper component 24 are formed of, for example, a conductor such as aluminum. The vacuum partition lower component 23 and the vacuum partition upper component 24 are connected to each other through a seal material 25 for airtightness.

The space interposed between the vacuum partition and the sample holder 200 is maintained at the atmospheric pressure or in a sub-atmospheric state having a lower vacuum degree than the sample chamber 12. The sample holder 200 is mounted on the stage 20 through the vacuum partition lower component 23. A vacuum evacuation system 26 that evacuates an internal space of the electron optical system, the stage 20, and the housing 10 to make a vacuum environment is controlled by a main control unit 27.

The main control unit 27 is connected to a computer 29 connected to a display unit 28. Using a user interface (GUI) on the computer 29 and the display unit 28, a user can operate the scanning electron microscope 100. The computer 29 is configured to transmit an instruction input by the user using the GUI to the main control unit 27, and the main control unit 27 controls each of the components in the scanning electron microscope 100 based on the instruction. Further, the computer 29 is configured to process image data from the main control unit 27 or to cause the display unit 28 to display an image.

As described above, the scanning electron microscope 100 is configured.

<Principle of Scanning Electron Microscope>

In the scanning electron microscope 100, by scanning the sample surface with the focused electron beam 13 in a vacuum, a signal output from the sample is detected, and the display unit 28 displays an enlarged image of the sample. Specifically, when the sample is irradiated with the electron beam 13 in a vacuum, secondary electrons are emitted from the sample. At this time, in addition to the secondary electrons, backscattered electrons, characteristic X-rays, or the like are emitted from the sample.

In the scanning electron microscope 100, an image is displayed using a signal obtained by detecting the secondary electrons or the backscattered electrons with the detector 21 or the detector 22. For example, the secondary electrons are electrons generated in the vicinity of the surface of the sample, and a secondary electron image obtained by detecting the secondary electrons reflects fine unevenness of the sample. On the other hand, the backscattered electrons are electrons that collide against atoms forming the sample to be backscattered, and the number of the backscattered electrons depends on the composition of the sample (for example, an average atomic number or a crystal orientation). As a result, a backscattered electron image is an image that reflects the composition distribution of the sample.

This way, the principle of the scanning electron microscope 100 is a principle in which the secondary electrons or the backscattered electrons generated by scanning the sample with the focused electron beam 13 are detected and an image is obtained from a signal based on the detected secondary electrons or backscattered electrons.

<Configuration of Sample Holder>

Next, the configuration of the sample holder 200 according to the embodiment will be described.

FIG. 4 is a plan view illustrating a planar shape of an upper tip 300 seen from the electron beam irradiation side.

As illustrated in FIG. 4, the upper tip 300 has a rectangular shape having a first long side 310 and a first short side 320. The upper tip 300 corresponds to "first member" described in "Solution to Problem". A window portion 330 through which an electron beam is irradiated is formed in a center portion of the upper tip 300. In addition, a guide portion 340 that surrounds the window portion 330 and extends to one end surface of the upper tip 300 is formed (indicated by a hatched region in FIG. 4).

FIG. 5 is a plan view illustrating a planar shape of a lower tip 400 seen from the electron beam irradiation side.

As illustrated in FIG. 5, the lower tip 400 has a rectangular shape having a second long side 410 and a second short side 420. The lower tip 400 corresponds to "second member" described in "Solution to Problem". A window portion 430 is formed in a center portion of the lower tip 400.

The upper tip 300 and the lower tip 400 configured as described above are disposed to overlap each other to form the sample holder 200. Specifically, FIG. 6 is a plan view illustrating the sample holder 200. As illustrated in FIG. 6, the upper tip 300 and the lower tip 400 forming the sample holder 200 are disposed such that the first long side 310 and the second short side 420 are parallel to each other and the second long side 410 and the first short side 320 are parallel to each other in a plan view. As a result, as illustrated in FIG. 6, the upper tip 300 includes: an overlapping portion that planarly overlaps the lower tip 400; and a non-overlapping portion that does not planarly overlap the lower tip 400. At this time, the guide portion 340 is configured to reach the non-overlapping portion from the window portion 330 through the overlapping portion in a plan view. This way, a planar shape of the sample holder 200 is configured.

Next, FIG. 7 is a cross-sectional view taken along line A-A of FIG. 6.

As illustrated in FIG. 7, in the sample holder 200, the upper tip 300 and the lower tip 400 are disposed to face each other. Here, the upper tip 300 is disposed on the irradiation side of the electron beam, whereas the lower tip 400 is disposed on a side opposite to the irradiation side of the electron beam.

In FIG. 7, a diaphragm 350 is provided in the window portion 330 of the upper tip 300, whereas a diaphragm 450 is provided in the window portion 430 of the lower tip 400. The upper tip 300 and the lower tip 400 are disposed such that the diaphragm 350 and the diaphragm 450 face each other through a space 600. The diaphragm 350 and the diaphragm 450 are formed of, for example, a carbon material, an organic material, a metal material, silicon nitride, silicon carbide, or silicon oxide. The thickness of each of the diaphragm 350 and the diaphragm 450 is several nanometers to several micrometers because a primary charged particle beam (electron beam) needs to transmit or pass through the diaphragm 350 and the diaphragm 450. In addition, the area of each of the diaphragm 350 and the diaphragm 450 is about several square micrometers to several square millimeters because the diaphragm 350 and the diaphragm 450 need to be prevented from breaking in a differential pressure for separating a vacuum and the atmospheric pressure. Further, the shape of each of the diaphragm 350 and the diaphragm 450 may be any shape of a square shape, a rectangular shape, or a circular shape.

In the sample holder 200 configured as described above, the space 600 interposed between the diaphragm 350 and the diaphragm 450 is filled with the liquid sample. For example, the liquid sample is dropped on the diaphragm 450 of the lower tip 400, and the upper tip 300 is disposed to overlap the lower tip 400. As a result, the space 600 is filled with the liquid sample.

FIG. 8 is a diagram illustrating a state where the sample holder 200 is filled with the liquid sample 500.

In FIG. 8, the space 600 interposed between the diaphragm 350 and the diaphragm 450 is filled with the liquid sample 500. At this time, when the amount of the dropped liquid sample 500 exceeds the volume of the space 600, a part of the liquid sample 500 leaks from the space 600. Here, in the sample holder 200 according to the embodiment, the guide portion 340 that extends from the space 600 to the non-overlapping portion through the overlapping portion is provided. As a result, the liquid sample 500 having an amount exceeding an amount of liquid with which the space 600 is fillable is guided by the guide portion 340 so as to be dropped from the side (vertically downward direction) opposite to the irradiation side of the electron beam. This way, the guide portion 340 has a function of guiding an outflow path of the liquid sample 500 that leaks from the space 600 along a preset path.

As described above, the sample holder 200 according to the embodiment is configured.

<First Specific Configuration Example of Guide Portion>
FIG. 9 is a diagram illustrating a first specific configuration example of the guide portion 340.

As illustrated in FIG. 9, the guide portion 340 can be configured by, for example, a groove 340A formed in the upper tip 300. That is, in a region where the groove 340A is formed, a gap between the upper tip 300 and the lower tip 400 increases. As the gap of the region increases, the leaked liquid sample 500 is more likely to flow. Therefore, by configuring the guide portion 340 by the groove 340A, the outflow path of the liquid sample 500 leaking from the space 600 can be guided along the groove 340A. As a result, the groove 340A functions as the guide portion 340.

<Second Specific Configuration Example of Guide Portion>
FIG. 10 is a diagram illustrating a second specific configuration example of the guide portion 340.

As illustrated in FIG. 10, the guide portion 340 can be configured by, for example, a coating 340B of a hydrophilic material provided in the upper tip 300. That is, in a region where the coating 340B is formed, due to the hydrophilicity of the coating 340B, the leaked liquid sample 500 is more likely to flow than in the other region (silicon region). Therefore, by configuring the guide portion 340 by the coating 340B of the hydrophilic material, the outflow path of the liquid sample 500 leaking from the space 600 can be guided along the coating 340B. As a result, the coating 340B of the hydrophilic material functions as the guide portion 340.

"Hydrophilicity" described in the embodiment represents that the hydrophilicity is higher than that of a material forming the upper tip 300 or the lower tip 400. The upper tip 300 and the lower tip 400 are formed of, for example, silicon. When the diaphragm 350 of the upper tip or the diaphragm 450 of the lower tip is formed of, for example, a silicon nitride film, the hydrophilic material forming the coating 340B only needs to have higher hydrophilicity than silicon and silicon nitride.

Characteristics of Embodiment

Next, a characteristic point of the embodiment will be described.

The characteristic point of the embodiment is that, for example, in the sample holder 200, the guide portion 340 that extends from the space 600 to the non-overlapping portion through the overlapping portion is provided as illustrated in FIG. 8. The function of the guide portion 340 will be described.

The function of the guide portion 340 is the function of guiding a liquid having an amount exceeding the amount of liquid with which the space 600 is fillable so as to be dropped in the vertically downward direction. In order to implement the function of the guide portion 340, in the embodiment, the planar shape of each of the upper tip 300 and the lower tip 400 forming the sample holder 200 is devised. Specifically, in the embodiment, for example, as illustrated in FIGS. 4 and 5, the planar shape of each of the upper tip 300 and the lower tip 400 is a rectangular shape.

As illustrated in FIG. 6, the upper tip 300 and the lower tip 400 are disposed to overlap each other such that the first long side 310 and the second short side 420 are parallel to each other and the second long side 410 and the first short side 320 are parallel to each other.

As a result, as illustrated in FIG. 6, the upper tip 300 includes: an overlapping portion that planarly overlaps the lower tip 400; and a non-overlapping portion that does not planarly overlap the lower tip 400. Based on this configuration, the guide portion 340 is configured to reach the non-overlapping portion from the space 600 through the overlapping portion. As a result, the function of the guide portion 340 that guides the liquid leaked from the space 600 to be dropped from the vertically downward direction is implemented. As a result of implementing the function of the guide portion 340, a liquid having an amount exceeding the amount of liquid with which the space 600 is fillable can be dropped in the intended vertically downward direction.

Further, due to the function of causing the liquid having an amount exceeding the amount of liquid with which the space 600 is fillable to easily flow to the outside from the space 600, an effect of suppressing an increase in internal pressure caused when the space 600 is filled with an excess amount of liquid is also obtained. This implies that breakage or curvature of the diaphragm 1300 and the diaphragm 1400 between which the space 600 is interposed can be suppressed as in the related art illustrated in FIGS. 11A and 11B. As a result, with the sample holder 200 according to the embodiment illustrated in FIG. 8, contamination of the sample chamber caused by the leakage of the liquid sample 500 due to the breakage of the diaphragm 350 and the diaphragm 450 can be prevented by the guide portion 340, and deviation in focal position for each field of view caused by the curvature of the diaphragm 350 and the diaphragm 450 when a pressure is applied to the diaphragm 350 and the diaphragm 450 can be suppressed.

Here, the liquid sample 500 dropped in the vertically downward direction is accumulated in the sample chamber of the electron microscope. Note that, since the sample chamber is in a vacuum state, the dropped liquid sample 500 is volatilized such that the sample chamber is contaminated.

Regarding this point, in the embodiment, for example, as in the scanning electron microscope 100 illustrated in FIG. 3, a drop region where the liquid sample 500 is dropped is sealed with the vacuum partition lower component 23, the vacuum partition upper component 24, and the seal material 25. That is, the scanning electron microscope 100 to which the sample holder 200 according to the embodiment is attached includes a sealing portion that seals the drop region where a liquid is dropped from a side of the sample holder opposite to the irradiation side of the electron beam by the guide portion 340 of the sample holder 200. For example, the sealing portion seals the drop region at the atmospheric pressure. This way, according to the embodiment, the contamination of the sample chamber caused by the dropped liquid sample 500 can be suppressed.

As described above, according to the embodiment, the guide portion 340 is formed in the sample holder 200, and the sealing portion that insulates and seals the drop position of the liquid sample 500 guided by the guide portion 340 from the vacuum atmosphere is provided in the scanning electron microscope 100. As a result, according to the embodiment, the room for improvement in the related art can be resolved.

Accordingly, the technical idea of the embodiment is extremely excellent in that the performance of the sample holder 200 that is fillable with liquid sample 500 can be improved and the scanning electron microscope 100 that is also suitable for the measurement of the liquid sample 500 can be provided.

First Modification Example

FIG. 12 is a diagram schematically illustrating a sample holder 200A according to a first modification example.

The sample holder 200A illustrated in FIG. 12 is different from the sample holder 200 illustrated in FIG. 7 in that the guide portion 340 formed in the sample holder 200A does not reach one end surface of the upper tip 300. In the sample holder 200A configured as described above, as compared to the sample holder 200 illustrated in FIG. 7, a potential that prevents a liquid having an amount exceeding the amount of liquid with which the space 600 is fillable from being unintentionally attached to the upper surface (surface) of the upper tip 300 can be increased.

Second Modification Example

Figure 13A:
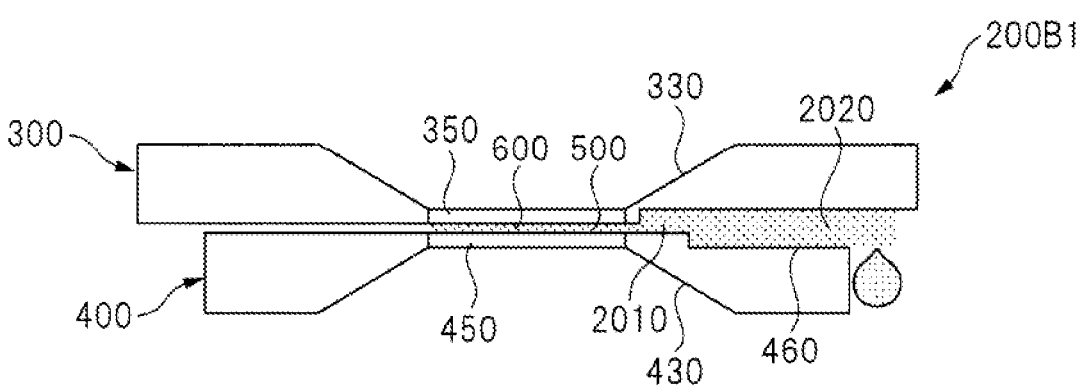
FIGS. 13A and 13B are diagrams schematically illustrating a sample holder according to a second modification example.
Figure 13B:
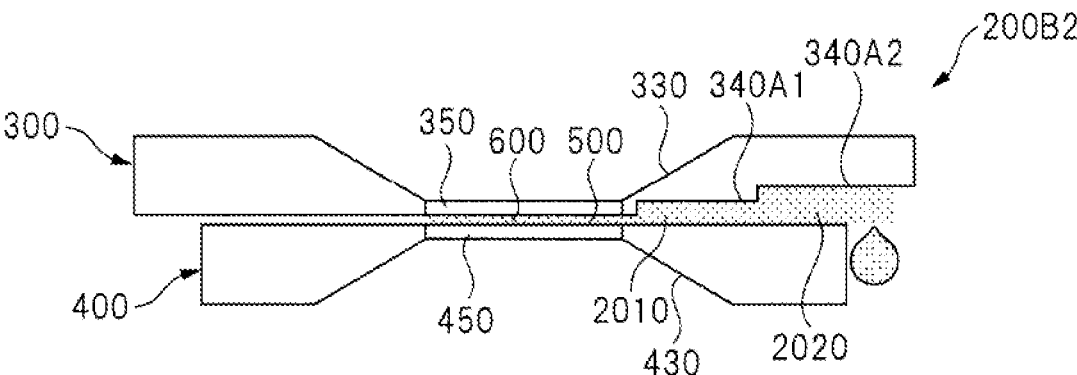

FIG. 13A is a diagram schematically illustrating a sample holder 200B1 according to a second modification example, and FIG. 13B is a diagram schematically illustrating a sample holder 200B2 according to the second modification example.

In FIG. 13A, for example, a groove 460 is formed in the lower tip 400. As a result, the sample holder 200B is configured to include: a first facing portion 2010 where the upper tip 300 and the lower tip 400 face each other at a first interval; and a second facing portion 2020 where the upper tip 300 and the lower tip 400 face each other at a second interval more than the first interval.

Note that the configuration that implements the first facing portion 2010 and the second facing portion 2020 is not limited to the above-described configuration. For example, as illustrated in FIG. 13B, by providing a groove 340A1 and a groove 340A2 having different depths in the upper tip 300 stepwise, the sample holder 200B can be configured to include: the first facing portion 2010 where the upper tip 300 and the lower tip 400 face each other at a first interval; and the second facing portion 2020 where the upper tip 300 and the lower tip 400 face each other at a second interval more than the first interval.

Here, the important point is the structure where the first facing portion 2010 and the second facing portion 2020 having different intervals are provided, and this structure may be implemented by changing the configuration of the lower tip 400 or changing the configuration of the upper tip 300. Further, the structure may be implemented by changing the configurations of both of the lower tip 400 and the upper tip 300.

Further, instead of providing the first facing portion 2010 and the second facing portion 2020 having different intervals, three or more facing portions having different intervals may be provided.

As a result, by setting the volume of the guide portion 340 to be larger, the performance of the guide portion 340 as a flow path can be further improved. Accordingly, a potential that prevents a liquid having an amount exceeding the amount of liquid with which the space 600 is fillable from being unintentionally attached to the upper surface (surface) of the upper tip 300 can be increased. As a result, the risk of breakage or curvature of the diaphragm 350 and the diaphragm 450 between which the space 600 is interposed can be more strongly suppressed.

Third Modification Example

FIG. 14 is a diagram schematically illustrating a sample holder 200C according to a third modification example.

The sample holder 200C illustrated in FIG. 14 is different from the sample holder 200 illustrated in FIG. 7 in that the guide portion 340 formed in the sample holder 200C does not reach both end surfaces of the upper tip 300. In the sample holder 200C configured as described above, as compared to the sample holder 200 illustrated in FIG. 7, the outflow path of a liquid having an amount exceeding the amount of liquid with which the space 600 is fillable can be enlarged. As a result, a potential that causes a liquid having an amount exceeding the amount of liquid with which the space 600 is fillable to flow to the outside of the space 600 can be increased.

Fourth Modification Example

FIG. 15 is a diagram schematically illustrating a sample holder 200D according to a fourth modification example.

In FIG. 15, the sample holder 200D is different from the sample holder 200 illustrated in FIG. 7, in that a guide portion 440 is formed in the lower tip 400, not in the upper tip 300. Even in the sample holder 200D configured as described above, for example, as illustrated in FIG. 16, a liquid having an amount exceeding the amount of liquid with which the space 600 is fillable can be dropped in the intended vertically downward direction by the guide portion 440. That is, the guide portion (340, 440) may be provided in the upper tip 300 or may be provided in the lower tip 400. Further, the guide portion (340, 440) may be provided in both of the upper tip 300 and the lower tip 400.

<Another Configuration of Scanning Electron Microscope>

Next, an example where a sample holder 200E obtained by embodying the technical idea of the embodiment is applied to a scanning electron microscope 100A having a different configuration from that of the scanning electron microscope 100 illustrated in FIG. 3 will be described. FIG. 17 is a diagram illustrating a schematic configuration of the scanning electron microscope 100A.

Hereinafter, a configuration different from that of the scanning electron microscope 100 illustrated in FIG. 3 will be mainly described.

In FIG. 17, in the sample holder 200E attached to the scanning electron microscope 100A, a conductor film 360 is provided on a surface on the irradiation side of the electron beam 13. This conductor film 360 is electrically connected to a bias voltage source 700 provided in the scanning electron microscope 100A, and a positive potential is applied to the conductor film 360 from the bias voltage source 700.

On the other hand, a detection electrode 800 is provided in the sample holder 200E attached to the scanning electron microscope 100A. The detection electrode 800 is disposed at a position that planarly overlaps the space filled with the liquid sample. The detection electrode 800 is electrically connected to the main control unit 27 through a signal detection unit 900. As described above, the scanning electron microscope 100A is configured.

<Configuration of Sample Holder>

FIG. 18 is a diagram illustrating a schematic configuration of the sample holder 200E attached to the scanning electron microscope 100A. In FIG. 18, in the sample holder 200E, the conductor film 360 is provided on the surface of the upper tip 300 on the electron beam irradiation side, and the detection electrode 800 is provided below the diaphragm 450 provided in the lower tip 400.

<Another Principle of Scanning Electron Microscope>

Next, the principle of the scanning electron microscope 100A illustrated in FIG. 17 will be described.

First, in a state where a bias voltage (positive potential) with respect to the detection electrode 800 is applied from the bias voltage source 700 to the conductor film 360, the liquid sample 500 is irradiated with the electron beam 13. Due to the irradiated electron beam 13, a local potential change occurs at an interface of the diaphragm 350 with the liquid sample 500. An electric signal based on the potential change is detected by the detection electrode 800 that is provided below the diaphragm 450 disposed on the side opposite to the diaphragm 350 with respect to the liquid sample 500.

The local potential change caused by the electron beam irradiation described above depends on the dielectric constant of the liquid sample 500 present immediately below the diaphragm 350. As a result, in the detection electrode 800, an electric signal having an intensity depending on the dielectric constant distribution of the liquid sample 500 is detected. As a result, image data based on the detection signal of the detection electrode 800 reflects a contrast of the liquid sample 500 as an observation target. This way, according to the scanning electron microscope 100A, an image can be acquired. That is, during irradiation with the electron beam 13 in a state where the sample holder 200E filled with the liquid sample 500 is attached to the scanning electron microscope 100A, the scanning electron microscope 100A is configured to obtain an image based on a size of a detection current flowing through the detection electrode 800 that is electrically connected to the conductor film 360 through the bias voltage source 700 and is disposed at a position planarly overlapping with the space 600.

Further, the principle will be described in detail. When the liquid sample 500 is irradiated with the electron beam 13 in a state where a bias voltage is applied to the conductor film 360, a local change in dielectric constant occurs in the liquid sample 500 due to the irradiation of the electron beam 13. When a local change in dielectric constant occurs in the liquid sample 500, a local change in electric field is induced. Specifically, a two-dimensional electric field distribution changes at an interface of the diaphragm 350 with the liquid sample 500. As a result, in the diaphragm 350, the number of electron-hole pairs generated based on the electric field distribution changes. This implies that the generated electrons flow to the conductor film 360 having a positive potential such that a detection current flowing to a closed circuit including the conductor film 360 and the detection electrode 800 as components changes. Accordingly, the detection current includes information regarding the image of the liquid sample 500, and the image can be acquired based on the size of the detection current.

<Usefulness of Application of Technical Idea of Embodiment>

Hereinafter, the usefulness of application of the technical idea of the embodiment to the sample holder attached to the scanning electron microscope 100A configured as described above will be described.

For example, in the sample holder attached to the scanning electron microscope 100A, for example, a circumstance in which a liquid leaks to the outside as illustrated in FIG. 2 is assumed. In this case, the leaked liquid moves up along the side surface (end surface) of the sample holder and may be attached to the surface of the sample holder on the electron beam irradiation side. In this case, in the sample holder attached to the scanning electron microscope 100A, the conductor film for applying the bias voltage to the surface on the electron beam irradiation side is provided. Therefore, the liquid may be attached to the conductor film.

When the liquid is attached to the conductor film, unintended short-circuiting may occur, which causes a problem in the operation of the scanning electron microscope 100A. Accordingly, in the sample holder attached to the scanning electron microscope 100A, it is necessary to prevent the liquid from being attached to the conductor film.

Regarding this point, in the sample holder 200E illustrated in FIG. 18, the technical idea of the embodiment is embodied. That is, in the sample holder 200E, as illustrated in FIG. 18, the guide portion 340 that extends from the space 600 to the non-overlapping portion through the overlapping portion is provided.

As a result, due to the function of the guide portion 340, a liquid having an amount exceeding the amount of liquid with which the space 600 is fillable can be dropped in the intended vertically downward direction. This implies that a potential at which a liquid having an amount exceeding the amount of liquid with which the space 600 is fillable is attached to the conductor film 360 formed on the surface on the electron beam irradiation side can be significantly reduced. As a result, in the sample holder 200E attached to the scanning electron microscope 100A, a fatal problem that the liquid is attached to the conductor film 360 to cause a problem in the operation of the scanning electron microscope 100A can be avoided. This way, the technical idea of the embodiment has an excellent effect when applied to the sample holder 200E attached to the scanning electron microscope 100A.

Further, when the technical idea of the embodiment is applied to the sample holder attached to the scanning electron microscope 100A, the following usefulness can also be obtained.

Figure 11B:
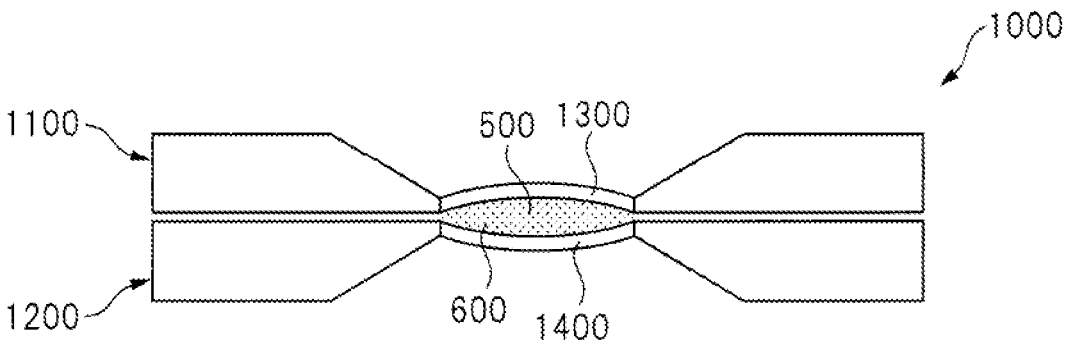
FIG. 11B is a diagram schematically illustrating curvature of the diaphragm.

For example, in the sample holder attached to the scanning electron microscope 100A, for example, a circumstance in which curvature occurs in the diaphragm is assumed (for example, refer to FIG. 11B). In this case, the distance between the upper and lower diaphragms increases, which implies that the detection current flowing through the detection electrode that is provided in the sample holder attached to the scanning electron microscope 100A is reduced. As a result, the detection current cannot be detected, and thus it is difficult to acquire an image. That is, in the scanning electron microscope 100A, there is a fatal problem in that it is difficult to acquire an image due to the phenomenon in which curvature occurs in the diaphragm.

Regarding this point, in the sample holder 200E illustrated in FIG. 18, the technical idea of the embodiment is embodied. That is, in the sample holder 200E, as illustrated in FIG. 18, the guide portion 340 that extends from the space 600 to the non-overlapping portion through the overlapping portion is provided.

Further, a liquid having an amount exceeding the amount of liquid with which the space 600 is fillable can be caused to easily flow to the outside from the space 600. As a result, an increase in internal pressure caused when the space 600 is filled with an excess amount of liquid can be suppressed. This implies that breakage or curvature of the diaphragm 350 and the diaphragm 450 between which the space 600 is interposed can be suppressed. As a result, in the sample holder 200E attached to the scanning electron microscope 100A, a decrease in detection current caused by the curvature in the diaphragm 350 and the diaphragm 450 can be suppressed, thus a fatal problem that it is difficult to acquire an image can be avoided. This way, the technical idea of the embodiment has an excellent effect when applied to the sample holder 200E attached to the scanning electron microscope 100A.

From the viewpoint of reducing a potential at which a liquid having an amount exceeding the amount of liquid with which the space 600 is fillable is attached to the conductor film 360 formed on the surface on the electron beam irradiation side, for example, a configuration in which the guide portion 340 does not reach the end surface of the upper tip 300 as illustrated in FIG. 12 is effective. The reason for this is that, with this configuration, since the liquid is not guided to the end surface of the upper tip 300, the upward movement of the liquid from the end surface of the upper tip 300 to the surface can be suppressed.

In addition, from the viewpoint of reducing a potential at which a liquid having an amount exceeding the amount of liquid with which the space 600 is fillable is attached to the conductor film 360 formed on the surface on the electron beam irradiation side, for example, a configuration in which the guide portion 440 is provided in the lower tip 400 is also effective (refer to FIGS. 15 and 16). The reason for this is that, even in this case, the liquid is not likely to be guided to the end surface of the upper tip 300.

Hereinabove, the present invention made by the present inventors has been described in detail based on the embodiments. However, the present invention is not limited to the embodiments, and it is needless to say that various modifications can be made within a range not departing from the scope of the present invention.

REFERENCE SIGNS LIST

10: housing
11: column
12: sample chamber
13: electron beam
14: pressure sensor
15: electron gun
16: condenser lens
17: objective lens
18: astigmatism corrector
19: deflector
20: stage
21: detector
22: detector
23: vacuum partition lower component
24: vacuum partition upper component
25: seal material
26: vacuum evacuation system
27: main control unit
28: display unit
29: computer
100: scanning electron microscope
200: sample holder
200A: sample holder
200B1: sample holder
200B2: sample holder
200C: sample holder
200D: sample holder
200E: sample holder
300: upper tip
310: first long side
320: first short side
330: window portion
340: guide portion
340A: groove
340A1: groove
340A2: groove
340B: coating
350: diaphragm
360: conductor film
400: lower tip
410: second long side
420: second short side
430: window portion
440: guide portion
450: diaphragm
460: groove
500: liquid sample
600: space
700: bias voltage source
800: detection electrode
900: signal detection unit
1000: sample holder
1100: upper tip
1200: lower tip
1300: diaphragm
1400: diaphragm
2010: first facing portion
2020: second facing portion

The invention claimed is:

1. A sample holder comprising:

a first member that is disposed on an irradiation side of an electron beam; and a second member that is disposed to face the first member, wherein the sample holder includes a first diaphragm that is provided in the first member, a second diaphragm that is provided in the second member, a space that is interposed between the first diaphragm and the second diaphragm and is fillable with a liquid, and a guide portion that guides a liquid having an amount exceeding an amount of liquid with which the space is fillable so as to be dropped from a side opposite to the irradiation side of the electron beam, wherein the guide portion begins at a central portion of the sample holder and ends at one outer edge of the sample holder.

2. The sample holder according to claim 1, wherein the guide portion is a groove that is provided in the first member or the second member.

3. The sample holder according to claim 1, wherein the guide portion is formed of a coating of a hydrophilic material that is provided in the first member or the second member.

4. The sample holder according to claim 1, wherein a planar shape of the first member is a rectangular shape having a first short side and a first long side, a planar shape of the second member is a rectangular shape having a second short side and a second long side, the first member and the second member are disposed such that the first long side and the second short side are parallel to each other and the second long side and the first short side are parallel to each other in a plan view, the first member includes an overlapping portion that planarly overlaps the second member, and a non-overlapping portion that does not planarly overlap the second member, and the guide portion is configured to guide the liquid from the space to the non-overlapping portion through the overlapping portion in a plan view.

5. The sample holder according to claim 1, wherein the sample holder includes a first facing portion where the first member and the second member face each other at a first interval, and a second facing portion where the first member and the second member face each other at a second interval more than the first interval.

6. The sample holder according to claim 1, wherein the first member includes a conductor film that is provided on a surface on the irradiation side of the electron beam.

7. The sample holder according to claim 1, wherein the sample holder is a sample holder for an electron microscope.

8. An electron microscope to which the sample holder according to claim 1 is attachable, the electron microscope comprising a sealing portion that seals a region where a liquid is dropped from a side of the sample holder opposite to the irradiation side of the electron beam by the guide portion of the sample holder.

9. The electron microscope according to claim 8, wherein the sealing portion seals the region at an atmospheric pressure.

10. An electron microscope to which a sample holder is attachable, the sample holder including a first member that is disposed on an irradiation side of an electron beam, a second member that is disposed to face the first member, a first diaphragm that is provided in the first member, a second diaphragm that is provided in the second member, a space that is interposed between the first diaphragm and the second diaphragm and is fillable with a liquid, and a guide portion that guides a liquid having an amount exceeding an amount of liquid with which the space is fillable so as to be dropped from a side opposite to the irradiation side of the electron beam, wherein the first member includes a conductor film that is provided on a surface on the irradiation side of the electron beam, the electron microscope comprising a detection electrode that is electrically connected to the conductor film through a bias voltage source and is disposed below the second diaphragm of the second member, wherein during irradiation with the electron beam in a state where the sample holder is attached to the electron microscope, the electron microscope is configured to obtain an image based on a size of a detection current flowing through the detection electrode that is disposed at a position planarly overlapping with the space.

* * * * *